(12) United States Patent
Saito

(10) Patent No.: US 8,237,196 B2
(45) Date of Patent: Aug. 7, 2012

(54) SEMICONDUCTOR DEVICE

(75) Inventor: Wataru Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 352 days.

(21) Appl. No.: 12/711,908

(22) Filed: Feb. 24, 2010

(65) Prior Publication Data

US 2010/0230717 A1  Sep. 16, 2010

(30) Foreign Application Priority Data

Mar. 13, 2009 (JP) ................................. 2009-61209

(51) Int. Cl.
*H01L 31/0328* (2006.01)
(52) U.S. Cl. .. 257/192; 257/194; 257/488; 257/E29.246
(58) Field of Classification Search .................. 257/183, 257/192, 194, 488, E29.246
See application file for complete search history.

(56) References Cited

U.S. PATENT DOCUMENTS

| | | |
|---|---|---|
| 7,075,125 B2 | 7/2006 | Saito et al. |
| 7,291,872 B2 * | 11/2007 | Hikita et al. ................. 257/192 |
| 7,573,078 B2 * | 8/2009 | Wu et al. ..................... 257/194 |
| 2005/0110042 A1 * | 5/2005 | Saito et al. .................. 257/192 |

FOREIGN PATENT DOCUMENTS

| | | |
|---|---|---|
| JP | 2002-16245 A | 1/2002 |
| JP | 2004-200248 A | 7/2004 |
| JP | 2004-214471 A | 7/2004 |
| JP | 2005-93864 A | 4/2005 |

* cited by examiner

*Primary Examiner* — Matthew E Warren
(74) *Attorney, Agent, or Firm* — Patterson & Sheridan, LLP

(57) ABSTRACT

A semiconductor device includes: a first semiconductor layer of non-doped $Al_xGa_{1-x}N$ ($0 \leq X < 1$); a second semiconductor layer of non-doped or n-type $Al_yGa_{1-y}N$ ($0 < Y \leq 1$, $X < Y$) on the first semiconductor layer; a first electrode on the second semiconductor layer; a second electrode on the second semiconductor layer that is separated from the first electrode and electrically connected to the second semiconductor layer; a first insulating film covering the first and second electrodes; a first field plate electrode electrically connected to the first electrode and covered by a second insulating film; and a second field plate electrode on the second insulating film, wherein a length of at least one of the first and second field plate electrodes in a first direction from the first electrode toward the second electrode changes periodically in a second direction intersecting the first direction.

17 Claims, 11 Drawing Sheets

US 8,237,196 B2

SEMICONDUCTOR DEVICE

CROSS REFERENCE TO RELATED APPLICATIONS

This application claims benefit of priority under 35 USC §119 to Japanese Patent Application No. 2009-061209, filed on Mar. 13, 2009, the contents of which are incorporated by reference herein.

BACKGROUND OF THE INVENTION

1. Field of the Invention

The present invention relates to a semiconductor device.

2. Related Background Art

A power semiconductor element such as a switching element or a diode is used in circuits such as a switching power supply and an inverter and desired to have such properties as a high breakdown voltage and a low turn on-resistance.

However, the breakdown voltage and the turn on-resistance are in a relationship of trade-off, which is determined by a material of the element. The main element material, silicon, has already reached almost its limits of low turn on-resistance by the past progresses in technological development. Therefore, in order to further lower the turn on-resistance, any other element material must be used.

Specifically, use of a nitride semiconductor such as GaN or AlGaN or a wide bandgap semiconductor such as silicon carbide (SiC) as the switching element material has improved the trade-off relationship determined by the element material. Thus, the turn on-resistance is dramatically lowered (see, for example, Japanese Patent Laid Open Pub. 2005-093864). It is to be noted that the elements which are made of a nitride semiconductor such as GaN or AlGaN and whose turn on-resistance can be easily lowered may include, for example, a hetero-structure field effect transistor (hereinafter referred to "HFET" simply) having an AlGaN/GaN hetero-structure. The HFET can be of low turn on-resistances because of a high mobility in hetero-structure interface channels and a high electron density due to piezoelectric polarization.

However, since the HFET is a horizontal type element, when it is supplied with a high voltage between its gate and drain, an electric field is concentrated to an end portion of the gate. If the electric field may be intensified due to the concentrated electric field, electrons accelerated by the high electric field are injected into a passivation film or an AlGaN layer, thus generating crystal defects. This results in a problem in that the properties fluctuate and the reliabilities of the element deteriorate.

Such deteriorations in reliability caused by a high electric field are suppressed effectively by relaxing the electric field concentration. Electric field relaxation may be realized by a field plate structure (see, for example, Japanese Patent Laid Open Pub. 2005-093864). Further, by forming a plurality of field plate electrodes and changing the thickness of insulating films under those field plate electrodes in such a manner that it may increase step-wise as it approaches the side of a drain, the number of the positions where electric field is concentrated increases, thus enabling lowering a peak of the electric field.

However, this method has a disadvantage in that a larger number of times of depositing insulating films may increase fluctuations in properties due to variations in their film thicknesses. Furthermore, this method may raise a problem in that, if the insulating films become too thick, a film stress is increased and thus cracks generate in the insulating films, resulting in deteriorations in reliability.

SUMMARY OF THE INVENTION

There is provided a semiconductor device comprising:
a first semiconductor layer of non-doped $Al_XGa_{1-X}N$ ($0 \leq X < 1$);
a second semiconductor layer of non-doped or n-type $Al_YGa_{1-Y}N$ ($0 < Y \leq 1$, $X < Y$) on the first semiconductor layer;
a first electrode on the second semiconductor layer;
a second electrode on the second semiconductor layer configured to be separated from the first electrode and electrically connected to the second semiconductor layer;
a first insulating film on the second semiconductor layer configured to cover the first and second electrodes;
a first field plate electrode on the first insulating film configured to be electrically connected to the first electrode;
a second insulating film configured to cover the field plate electrode; and
a second field plate electrode on the second insulating film,
wherein a length of at least one of the first and second field plate electrodes in a first direction changes periodically in a second direction, the first direction being a direction from the first electrode toward the second electrode and the second direction perpendicularly intersecting with the first direction.

DETAILED DESCRIPTION OF THE INVENTION

Figure 1:
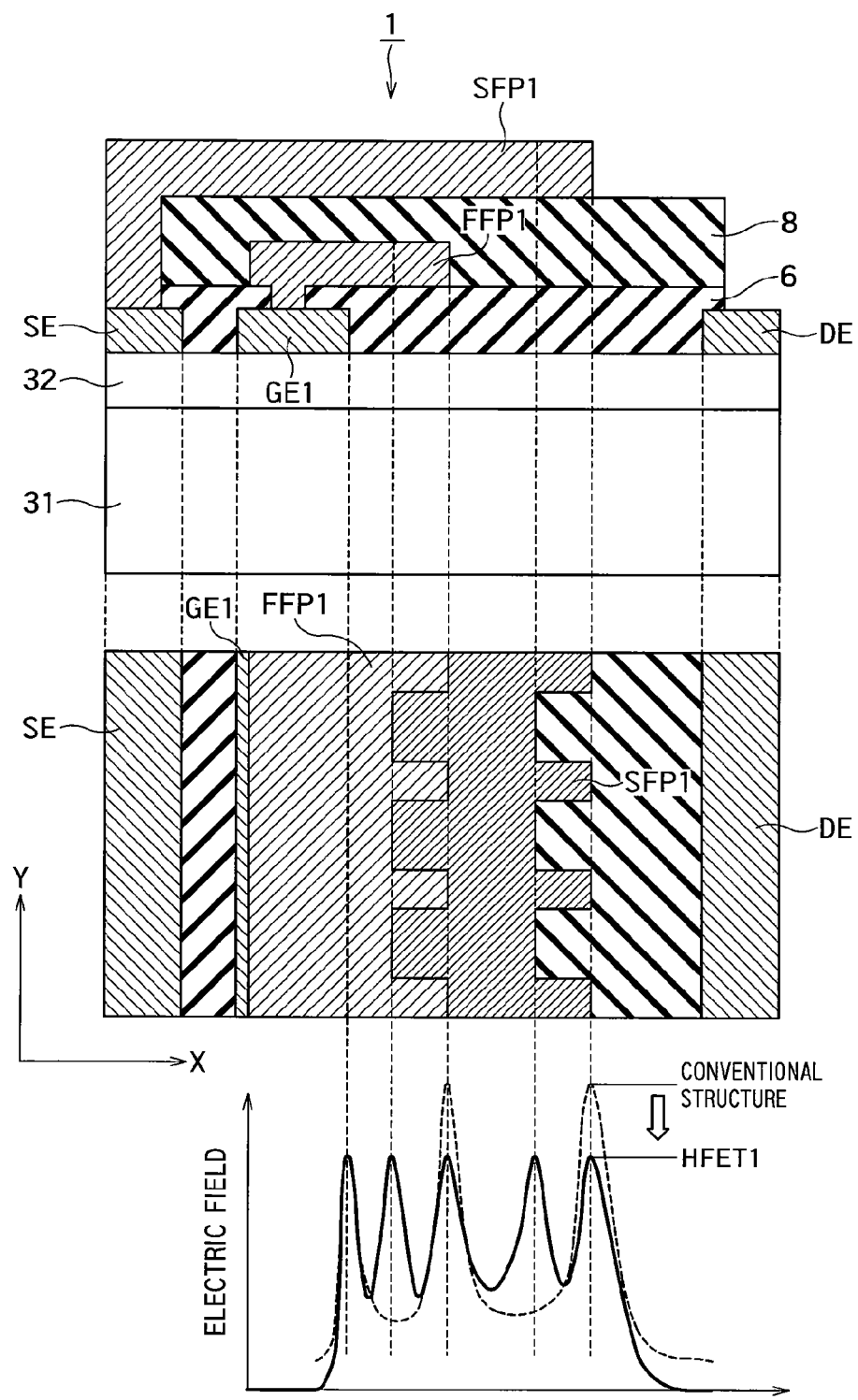
FIG. 1 shows an outlined constitution of a GaN-HFET according to a first embodiment of the present invention.

A description will be given of several embodiments of the present invention with reference to the drawings. In the drawings, identical reference numerals are given to similar components, and description on the similar components will be repeated only if it is needed.

(First Embodiment)

FIG. 1 shows the outlined constitution of a GaN-HFET according to the first embodiment of the present invention.

As shown in an outlined cross-sectional view at the upper part in FIG. 1, a GaN-HFET1 in the present embodiment includes a channel layer 31, a barrier layer 32, a source electrode SE, a drain electrode DE, a gate electrode GE1, insulating films 6 and 8, and field plate electrodes FFP1 and SFP1.

The channel layer 31 is formed of a non-doped GaN layer and corresponds to, for example, a first semiconductor layer in the present embodiment. The barrier layer 32 is formed of a non-doped AlGaN layer on the channel layer 31 and corresponds to, for example, a second semiconductor layer in the present embodiment. The gate electrode GE1 is formed on the barrier layer 32 in such a manner as to provide a Schottky contact between itself and the barrier layer 32. The gate electrode GE1 corresponds to, for example, a first electrode in the present embodiment. The source electrode SE and the drain electrode DE are formed on the barrier layer 32 as separated from each other in such a manner as to be electrically connected to the barrier layer 32 and in such a manner that the gate electrode GE1 is interposed between the source electrode SE and the drain electrode DE. In the present embodiment, the drain electrode DE corresponds to, for example, a second electrode and the source electrode SE, for example, a third electrode. It is to be noted that a direction from the source electrode SE toward the drain electrode DE is assumed to be an X-direction and that perpendicularly intersecting the X-direction in the plan view, a Y-direction.

Then, the insulating film 6 is formed on the barrier layer 32 in such a manner as to cover the source electrode SE, the drain electrode DE, and the gate electrode GE1. The field plate electrode FFP1 is formed on the insulating film 6 in such a manner as to be electrically connected to the gate electrode GE1. In the present embodiment, the insulating film 6 and the field plate electrode FFP1 correspond to, for example, a first insulating film and a first field plate electrode, respectively. Further, the insulating film 8 is formed in such a manner as to cover the field plate electrode FFP1, and the field plate electrode SFP1 is formed on the insulating film 8 in such a manner as to be electrically connected to the source electrode SE. In the present embodiment, the insulating film 8 and the field plate electrode SFP1 correspond to, for example, a second insulating film and a second field plate electrode, respectively.

As shown in the plan view at the midsection of FIG. 1, the field plate electrodes FFP1 and SFP1 are each formed like a comb in a plan view. Therefore, the length of each of the field plate electrodes in the X-direction from the source electrode SE to the drain electrode DE changes periodically in the Y-direction. In the present embodiment, the X- and Y-directions correspond to, for example, first and second directions, respectively.

By thus changing the X-directional lengths of the field plate electrodes FFP1 and SFP1 in the Y-direction, those electrodes have end portions at their long and short portions, respectively. Since an electric field is concentrated to all of those end portions, it is possible to lower the peak of the electric field (which is indicated by a solid line) as compared to a conventional structure in which the X-directional lengths do not change (which is indicated by a dotted line), as shown in an electric field distribution graph at the lower part in FIG. 1.

If the electric field peak is lowered, a probability decreases that electrons in the channel which have gained a high energy level due to acceleration jump into the barrier layer 32 made of AlGaN or the insulating film 6. It will suppress the occurrence of crystal defects and interface levels so that the properties such as a leakage current, a breakdown voltage, and a turn on-resistance may not fluctuate easily. Thus, the reliabilities of the semiconductor device can be improved.

It is to be noted that for ease of explanation, in the plan view in FIG. 1, some portions of the insulating film 8, the field plate electrode SFP1 and the insulating film 6 are omitted. Specifically, for the insulating film 8, the portion ranging from the right end thereof to the left end of the drain electrode DE and the portion ranging from the left end thereof to the right end of the field plate electrode SFP1 are omitted. Regarding the field plate electrode SFP1, the portion ranging from the left end thereof to the right end of the field plate electrode FFP1 is omitted. Furthermore, regarding the insulating film 6, only the portion between the left end of the gate electrode GE1 and the right end of the source electrode SE is depicted. Such omissions hold true also with a plan view in each of the following FIGS. 2, 3, and 5 to 8.

Figure 2:
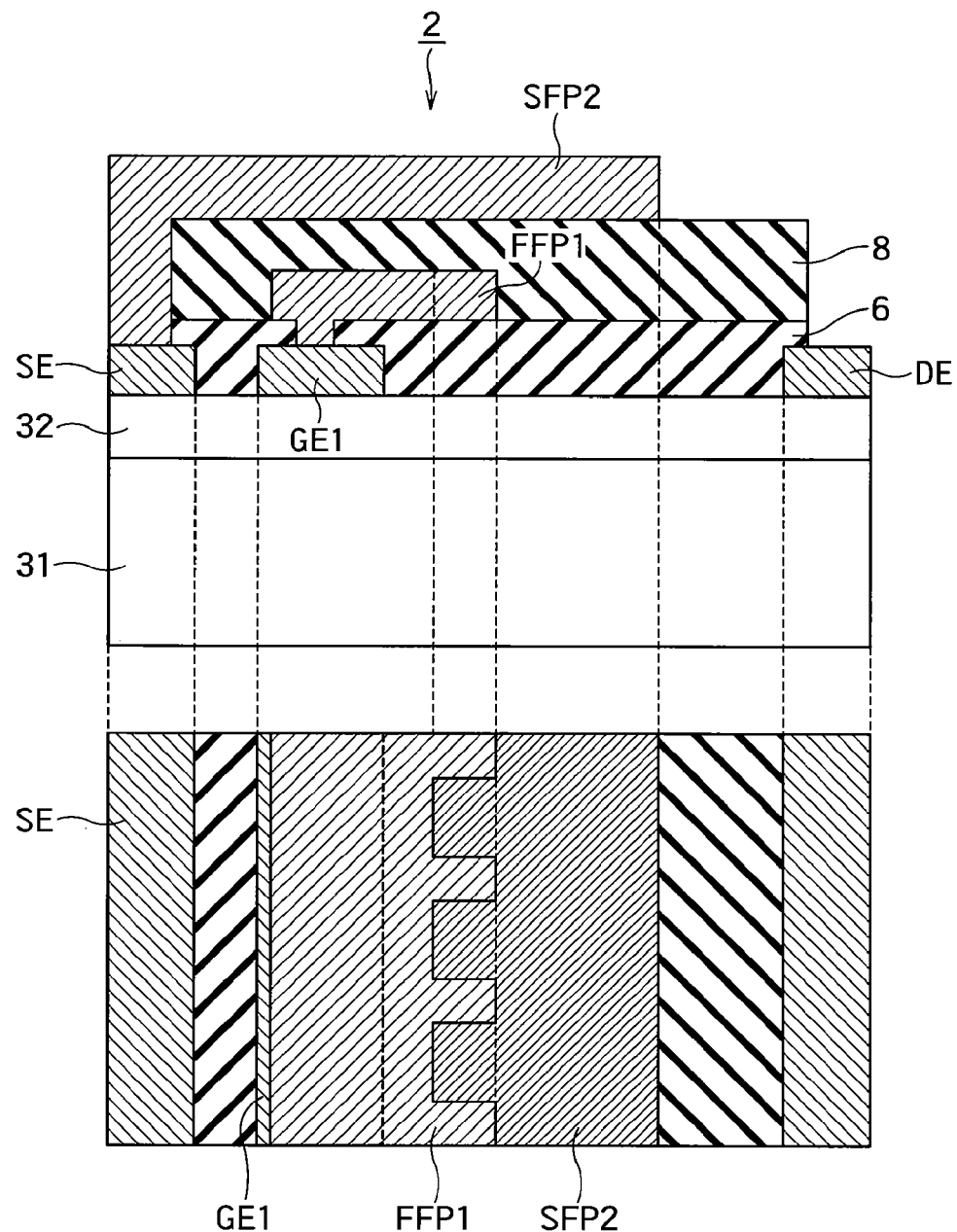
FIG. 2 shows a first variant of the GaN-HFET of FIG. 1.

Although in FIG. 1, the GaN-HFET1 is shown in which the X-directional length of each of the field plate electrodes FFP1 and SFP1 changes in the Y-direction, the present invention is not limited to it; for example, as shown in FIG. 2, such a GaN-HFET2 can be implemented that the X-directional length may change only of the field plate electrode FFP1, not of the field plate electrode SFP2. Further, as shown in FIG. 3, such a GaN-HFET3 can be implemented that the X-directional length may change only of the field plate electrode SFP1, not of the field plate electrode FFP2.

Figure 3:
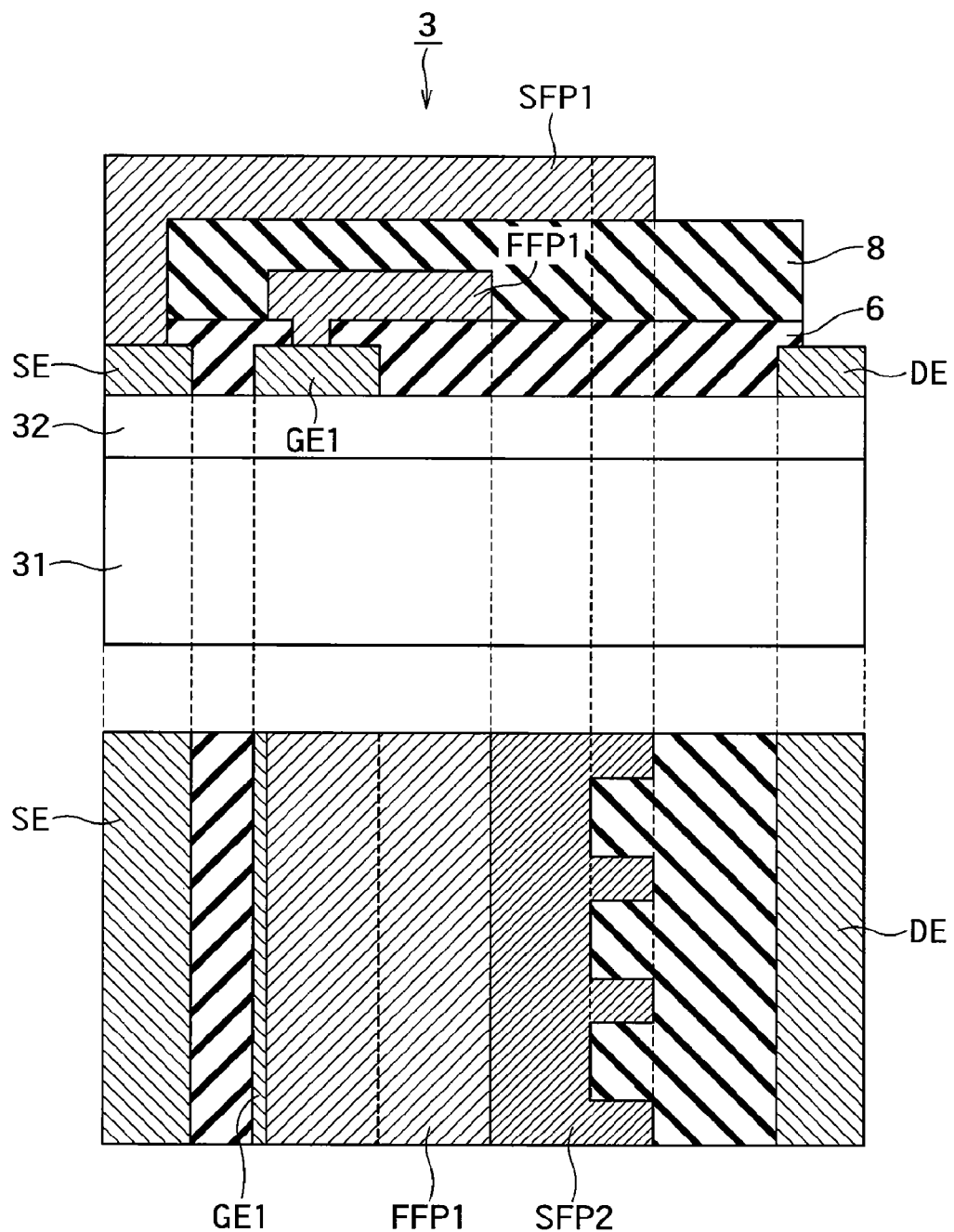
FIG. 3 shows a second variant of the GaN-HFET of FIG. 1.
Figure 4A:
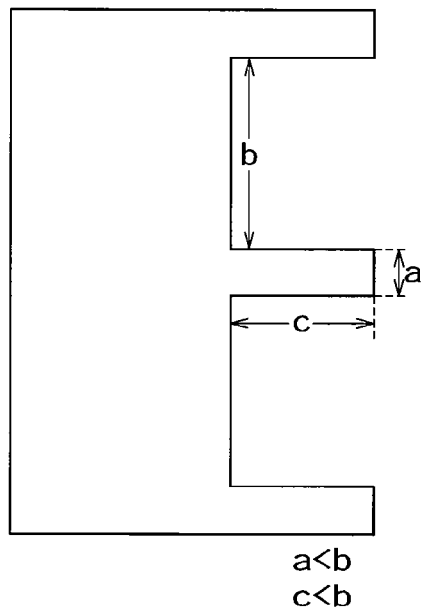
FIGS. 4A to 4C show third and fourth variants of the GaN-HFET of FIG. 1 respectively.

Further, although FIGS. 1 to 3 show the field plate electrodes FFP1 and SFP1 having a comb-like planar shape, preferably, as shown in, for example, FIG. 4A, the width "a" of the portion where the electrode is long is smaller than the width "b" of the portion where the electrode is short (a<b) so that an electric field may be concentrated not only on the end portion of the field plate electrode that is nearest the drain electrode DE but also on its second nearest end portion. Similarly, preferably a difference "c" between the long portion and short portion lengths is smaller than the short portion width "b" (c<b).

Figure 4B:
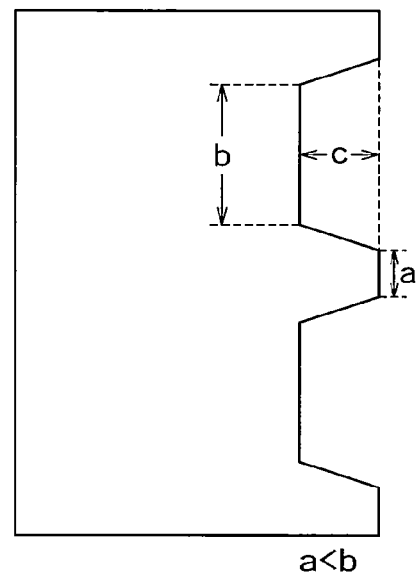

Further, the planar shape of the field plate electrodes is not limited to a comb; for example, almost the same effects can be obtained even with a trapezoid wave-like shape such as shown in FIG. 4B. In the case of the trapezoid wave-like shape also, in order to concentrate an electric field not only on the end portion nearest the drain electrode DE but also on the end portion which is second-nearest the drain electrode DE, it is preferable that the width "a" of the portion where the electrode is long is smaller than the width "b" of the portion where the electrode is short (a<b) as shown in FIG. 4B. Similarly, preferably the difference "c" between the long portion and short portion lengths is smaller than the short portion width "b" (c<b).

Figure 4C:
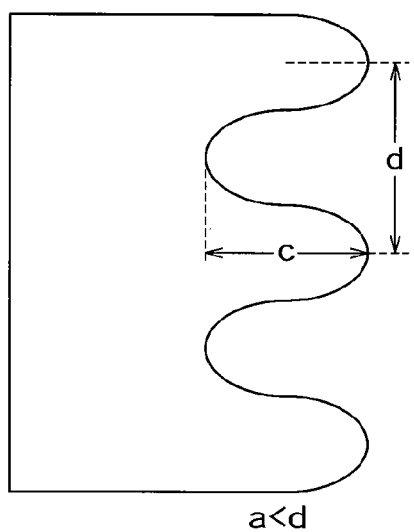

Furthermore, as shown in FIG. 4C, the planar shape of the field plate electrodes can be like a wave in implementation. In the present example also, preferably, a period "d" in which the electrode length changes is larger than the difference "c" between the long and short portions (c<d) so that an electric field may be concentrated not only on the end portion that is nearest the drain electrode DE but also on the second nearest end portion.

(2) Second Embodiment

Figure 5:
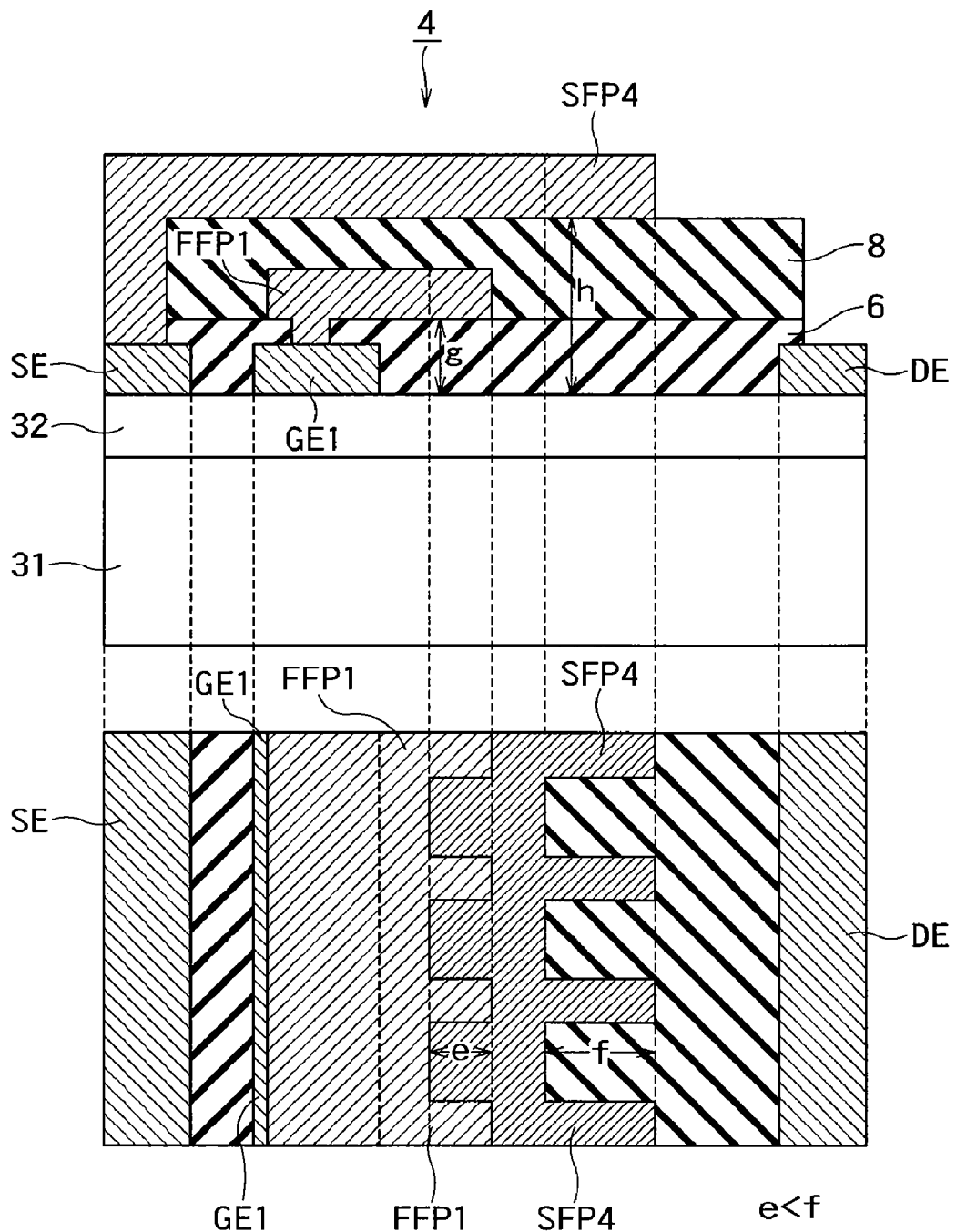
FIG. 5 shows an outlined constitution of a GaN-HFET according to a second embodiment of the present invention.
Figure 6:
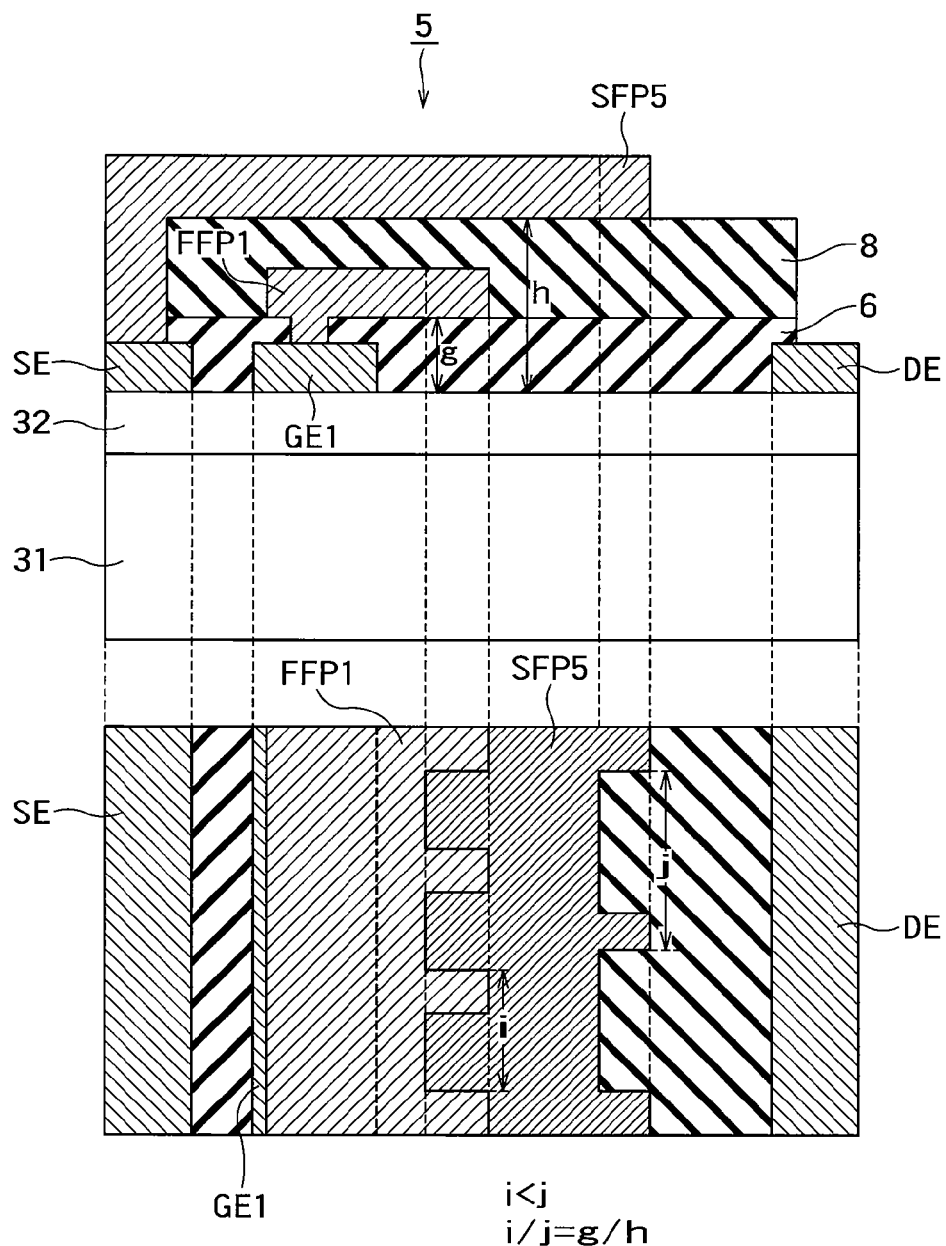
FIG. 6 shows one variant of the GaN-HFET of FIG. 5.

FIG. 5 shows the outlined constitution of a GaN-HFET according to the second embodiment of the present invention. The second through sixth embodiments will be described only on their differences from the first embodiment.

As may be clear from comparison to FIG. 1, a first feature of a GaN-HFET4 in the present embodiment is that the amount of the change "e" in length of the field plate electrode FFP1 is smaller than the amount of the change "f" in length of a field plate electrode SFP4 (e<f). By thus greatly changing the X-directional lengths between the field plate electrodes FFP1 and SFP4, a more relaxed electric field distribution can be obtained.

Further, a second feature of a GaN-HFET4 is that the total sum "h" of the thicknesses of insulating films 6 and 8 under the field plate electrode SFP4 is larger than the thickness "g" of the insulating film 6 under the field plate electrode FFP1

(g<h). By thus changing the thickness of the insulating films immediately under the field plate electrodes, according to the difference of the X-directional lengths between the field plate electrodes FFP1 and SFP4, the peak of the electric field can be lowered further. Preferably, a ratio e/f of the changes in length between the field plate electrodes FFP1 and SFP4 is made equal to a ratio (g/h) of the thickness "g" of the insulating film 6 and the total sum "h" of the thicknesses of the insulating films 6 and 8. Further, as in the case of a fifth variant shown in FIG. 6, by making the period "j" in which the length of a field plate electrode SFP5 changes larger than the period "i" in which the length of the field plate electrode FFP1 changes (i<j), almost the same effects can be obtained. Preferably, the ratio between the periods "I" and "j" for the lengths of the field plate electrodes is made equal to the ratio between the insulating films thicknesses "g" and "h" (i/j=g/h).

(3) Third Embodiment

Figure 7:
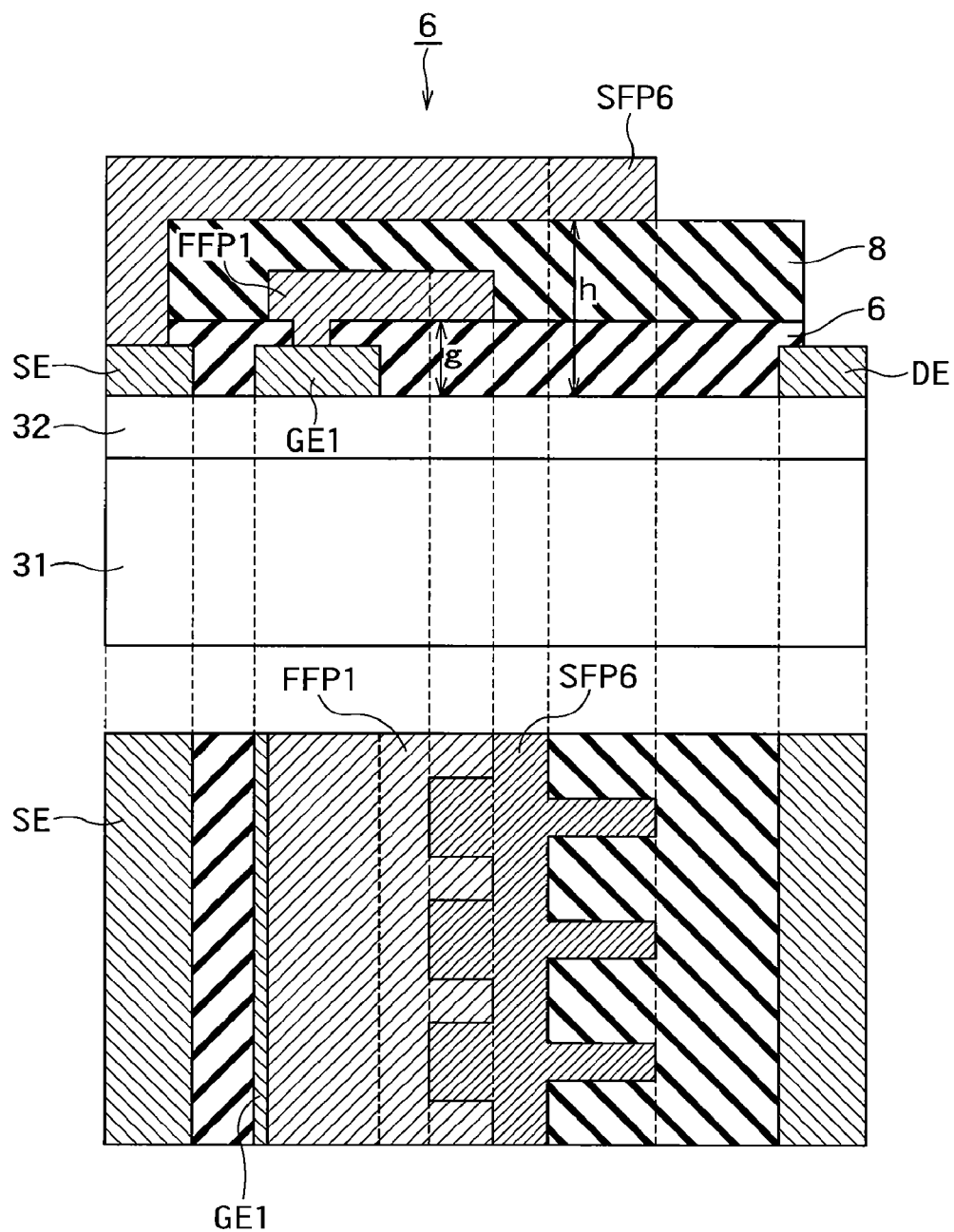
FIG. 7 shows an outlined constitution of a GaN-HFET according to a third embodiment of the present invention.

FIG. 7 shows the outlined constitution of a GaN-HFET according to a third embodiment of the present invention.

As may be clear from comparison to FIG. 5, the feature of a GaN-HFET6 in the present embodiment is that X-directional lengths of the respective field plate electrodes FFP1 and SFP6 change in a period common to them but in phases different from each other. By using such a structure, an electric field is securely concentrated on dispersed positions, so that its peak can be lowered further. Although FIG. 7 has shown such a structure that one phase might shift by half the other period, the present invention is not limited to it; for example, almost the same effects can be obtained as long as one phase shifts even by the quarter of the other period.

(4) Fourth Embodiment

Figure 8:
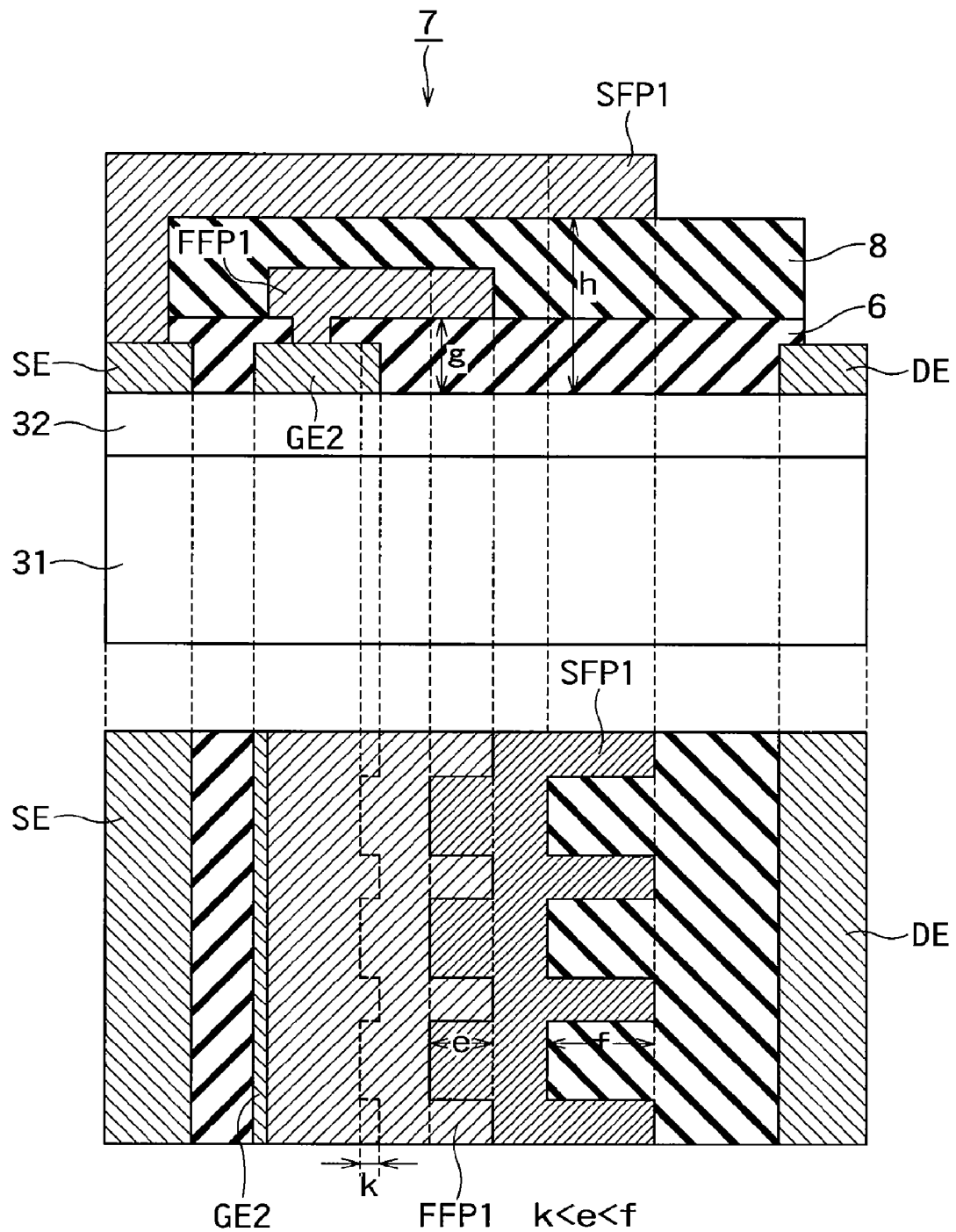
FIG. 8 shows an outlined constitution of a GaN-HFET according to a fourth embodiment of the present invention.

FIG. 8 shows the outlined constitution of a GaN-HFET according to a fourth embodiment of the present invention.

As may be clear from comparison to FIG. 5, the feature of a GaN-HFET7 in the present embodiment is that the X-directional lengths change periodically in the Y-direction not only of field plate electrodes but also of a gate electrode GE2. By using such an electrode structure, an end of the gate divaricates into two portions on the side of the drain electrode DE so that an electric field may be concentrated on a larger number of positions. Thus, the electric field peak at the gate end can be lowered.

Although FIG. 8 has shown the gate electrode GE2 having a comb-like planar shape, the present invention is not limited to it; for example, in much the same way as in the case of the shapes of the field plate electrodes, the present invention can be implemented even with any other shapes such as shown in, for example, FIGS. 4B and 4C. In the present embodiment, an AlGaN barrier layer 32 is thinner than insulating films 6 and 8. Thus, in order to evenly disperse electric field concentration, a change "k" in length of the gate electrode GE2 is preferably smaller than the changes "e" and "f" in length of the respective field plate electrodes FFP1 and SFP4 (k<e<f).

(5) Fifth Embodiment

Figure 9:
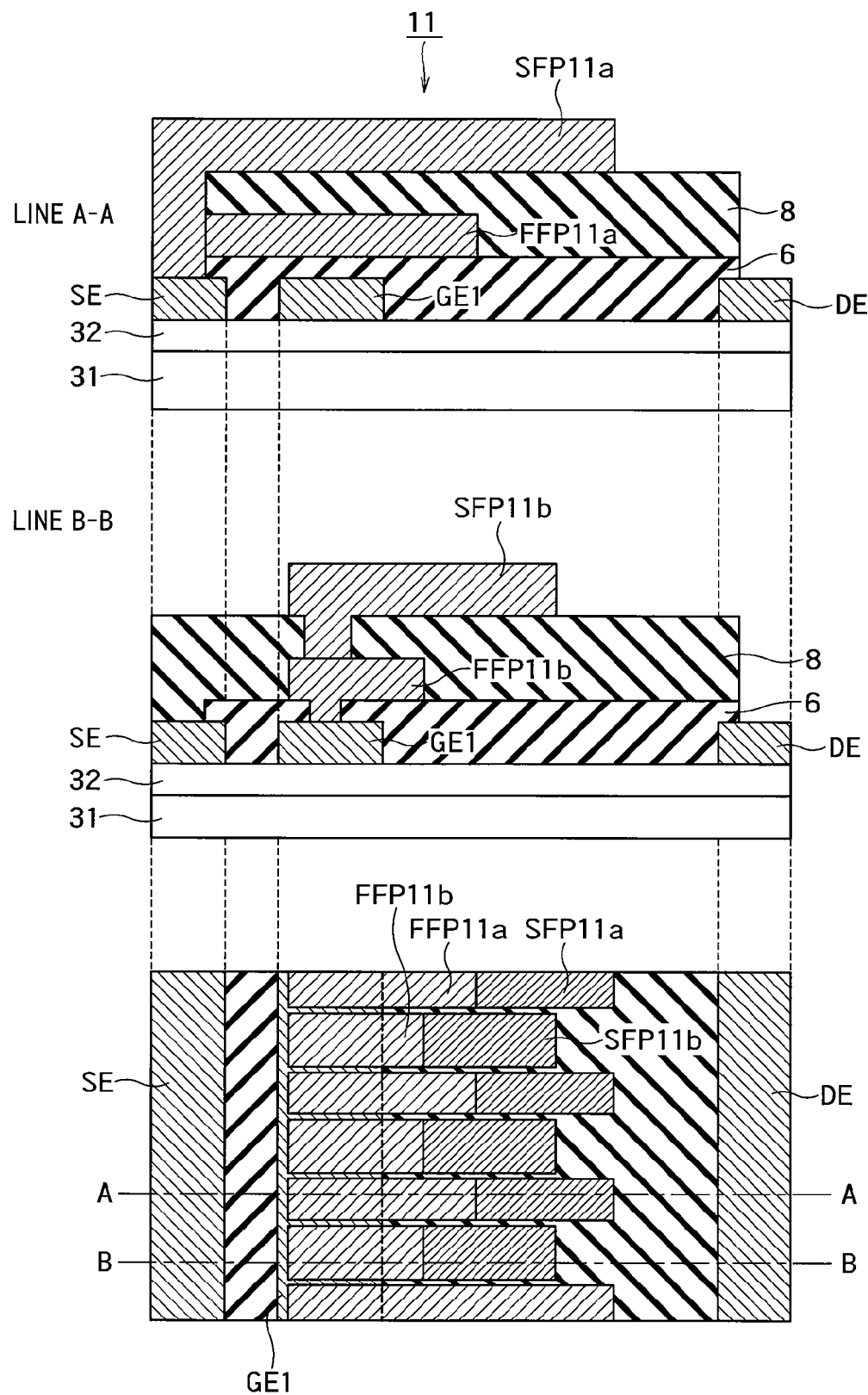
FIG. 9 shows an outlined constitution of a GaN-HFET according to a fifth embodiment of the present invention.

FIG. 9 shows the outlined constitution of a GaN-HFET according to the fifth embodiment of the present invention. A cross-sectional view at the upper part in the figure shows the HFET taken along line A-A of a plan view at the lower part in the figure and a cross-sectional view at the midsection in the figure shows the HFET taken along line B-B of the plan view at the lower part in the figure.

As may be clear from comparison to FIG. 1, the feature of a GaN-HFET11 in the present embodiment is that stacked field plate electrodes include field plate electrodes FFP11a and SFP11a connected to a source electrode SE and field plate electrodes FFP11b and SFP11b connected to a gate electrode GE1 and that the lengths of the field plate electrodes FFP11a, SFP11a and FFP11b and SFP11b are different to each other in the X-direction. By using such a structure, an electric field is concentrated on further dispersed positions, and the peak thereof can be further lowered, thereby almost the same effects are provided as those by the structures described above.

The present embodiment gives another advantage in that by changing the X-directional length between the field plate electrodes FFP11a and SFP11a which are connected to the source electrode SE and the field plate electrodes FFP11b and SFP11b which are connected to the gate electrode GE1, it is possible to change a gate to source capacitance, a gate to drain capacitance, and a drain to source capacitance, respectively. It is to be noted that as shown in the plan view at the lower part in the FIG. 9, the field plate electrodes FFP11a and SFP11a and the field plate electrodes FFP11b and SFP11b are insulated from each other by a portion of insulating films 6 and 8.

In the GaN-HFET11 shown in FIG. 9, the field plate electrodes FFP11a and SFP11a connected to the source electrode SE and the field plate electrodes FFP11b and SFP11b connected to the gate electrode GE1 have a larger area of portion facing to each other, which increases the gate to source capacitance, thus this HFET will not easily malfunction even if the gate electrode GE1 is affected by noise. Further, due to the larger gate to source capacitance, electrostatic discharge failures will not easily occur.

Figure 10:
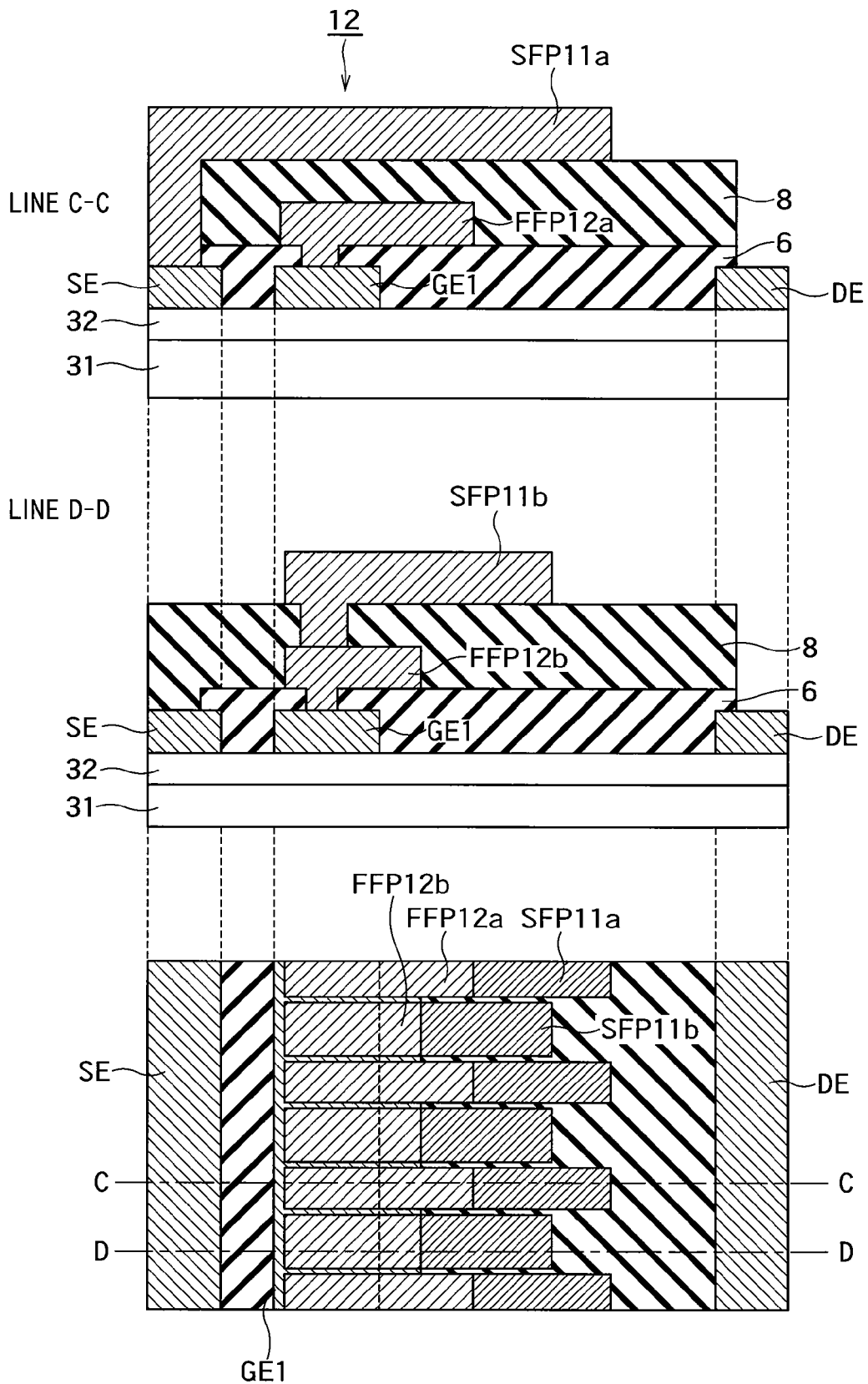
FIG. 10 shows one variant of the GaN-HFET of FIG. 9.

FIG. 10 shows one variant of the GaN-HFET11 shown in FIG. 9. A GaN-HFET12 shown in FIG. 10 includes a field plate electrode FFP12a and FFP12b connected only to the gate electrode GE1 and having a comb-like planar shape, a field plate electrode SFP11a connected only to the source electrode SE, and a field plate electrode SFP11b connected only to the gate electrode GE1. By employing such a structure, the GaN-HFET12 in the present variant can increase the gate to drain capacitance to suppress dV/dt at the time of switching, thereby lowering a surge voltage.

By thus arbitrarily setting the length of each of the field plate electrodes, the capacitance value can be changed. Accordingly, besides the combinations shown in the figures, the present invention can be implemented by variously changing the length of the field plate electrodes connected to the source electrode SE and the length of the field plate electrodes connected to the gate electrodes GE1 and GE2.

It is to be noted that for ease of explanation, in the plan views in FIGS. 9 and 10, portions of the field plate electrodes FFP11a, FFP11b, FFP12, SFP11a, and SFP11b ranging from the left end of the gate electrodes GE1 and GE2 to the left side of each field plate electrode are omitted.

(6) Sixth Embodiment

Figure 11:
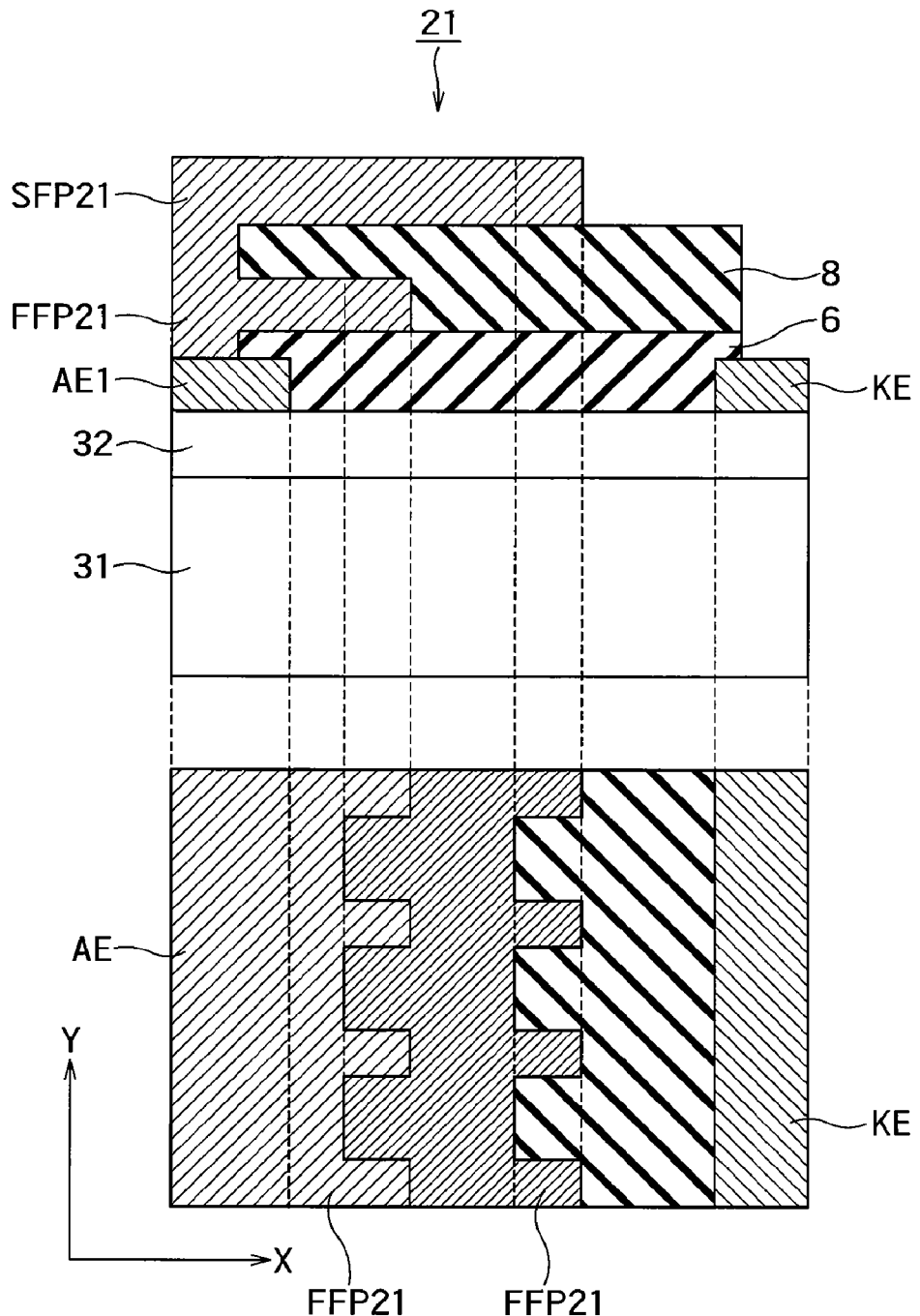
FIG. 11 shows an outlined constitution of a GaN-HSBD according to a sixth embodiment of the present invention.

FIG. 11 shows the outlined constitution of a semiconductor device according to the sixth embodiment of the present invention. A GaN-HSBD21 shown in the figure is a Schottky barrier diode using a hetero-structure and, as may be clear from comparison to FIG. 1, has such a structure that the gate to drain portions of the HFET1 might have been applied to an HSBD.

Specifically, as shown in a schematic cross-sectional view at the upper part in FIG. 11, the structure of the GaN-HSBD21 corresponds to a structure in which the left end of the gate electrode GE1 through the left side are removed from the HFET1 of FIG. 1, the gate electrode GE1 is replaced with an anode electrode AE formed on the barrier later 32 in such a manner as to provide a Schottky contact between itself and the barrier layer 32, and the drain electrode DE is replaced with a cathode electrode KE formed in such a manner as to provide Ohmic contact between itself and the barrier layer 32. Field plate electrodes FFP21 and SFP21 of the HSBD21 also correspond to the field plate electrodes FFP1 and SFP1 of the HFET1 in FIG. 1, respectively, and the field plate electrodes FFP21 and SFP21 are essentially the same as the field plate electrodes FFP1 and SFP1 except only that the field plate electrode SFP21 is electrically connected to the anode electrode AE. In the present embodiment, the anode electrode AE and the cathode electrode KE correspond to, for example, the first and second electrodes, respectively.

Similar to the HFET1 in FIG. 1, in the GaN-HSBD21 in the present embodiment also, by changing X-directional lengths of the field plate electrodes FFP21 and SFP21 in the Y-direction, an electric field concentration can be dispersed, thereby improving reliabilities of the semiconductor device.

Although FIG. 11 has shown the GaN-HFET1 having a structure in which the X-directional length of both of the field plate electrodes FFP21 and SFP21 changes in the Y-direction, the present invention is not limited to it; for example, the length of either one of the field plate electrodes may change as in the cases of, for example, the variants HFET2 and HFET3 shown in FIGS. 2 and 3, respectively.

Further, although FIG. 11 has shown the field plate electrode having a comb-like planar shape, the present invention is not limited to it; for example, of course, the electrodes may have different planar shapes as shown in FIGS. 4B and 4C.

(7) Seventh through Ninth Embodiments

Similar to the sixth embodiment described above, the seventh through ninth embodiments of the present invention relate to a GaN-HSBD and correspond to structures in which the gate electrodes GE1 and GE2 of the HFETs 4 to 7, described above with reference to FIGS. 5 to 8, are replaced with anode electrodes formed on the barrier layers 32 in such a manner as to provide Schottky contacts between themselves and the barrier layers 32, and the drain electrodes DE of the HFETs 4 to 7 are replaced with a cathode electrodes formed in such a manner as to provide Ohmic contacts between themselves and the barrier layers 32. Also, the structure of field plate electrodes is essentially the same as that of the field plate electrodes in the HFETs 4 to 7 except that the stacked two field plate electrodes are both electrically connected to the anode electrode. In according with the seventh through ninth embodiments, by using such a structure, an electric field is securely concentrated on dispersed positions, so that its peak can be lowered further, thus resulting in improvements of the semiconductor device.

(8) Other Embodiments

Although there has been hereinabove described the embodiments of the present invention, it should be appreciated that the present invention is not limited thereto and can be applied to any modifications which those skilled in the art should think of within the scope of the present invention.

For example, although in the description of the above-described embodiments, the substrate in which the channel layer 31 is formed has not shown in particular, the present invention is not limited to any specific substrate material; for example, besides a sapphire substrate, any other substrates such as a SIC substrate, a Si substrate, and a GaN substrate can be used. Further, the present invention is not limited to the insulation properties, the conductivity, or the conductivity type of the substrate.

Further, although the above embodiments have been described with reference to the combinations of AlGaN/GaN as the barrier layer 32 and the channel layer 31, the present invention is not limited to them; the present invention can be implemented also with any combinations of, for example, GaN/InGaN, AlN/AlGaN and so forth.

Further, although the above embodiments have been described with reference to the non-doped AlGaN barrier layer and the non-doped GaN channel layer, the present invention can be implemented also by using an n-type AlGaN layer, an n-type GaN layer, or an n-type AlN layer.

Further, although the above embodiments have been described with reference to the Schottky gate structure, the present invention can be implemented also by using a variety of modified gate structures such as a metal insulator semiconductor (MIS) gate structure in which a gate insulating film is formed under the gate electrode or a normally-off structure by forming a p-type GaN layer, a p-type AlGaN layer, or a recess structure.

What is claimed is:

1. A semiconductor device comprising:
   a first semiconductor layer of non-doped $Al_XGa_{1-X}N$ ($0 \leqq X < 1$);
   a second semiconductor layer of non-doped or n-type $Al_YGa_{1-Y}N$ ($0 < Y \leqq 1$, $X < Y$) on the first semiconductor layer;
   a first electrode on the second semiconductor layer;
   a second electrode on the second semiconductor layer configured to be separated from the first electrode and electrically connected to the second semiconductor layer;
   a first insulating film on the second semiconductor layer configured to cover the first and second electrodes;
   a first field plate electrode on the first insulating film configured to be electrically connected to the first electrode;
   a second insulating film configured to cover the field plate electrode; and
   a second field plate electrode on the second insulating film,
   wherein a length of at least one of the first and second field plate electrodes in a first direction changes periodically in a second direction, the first direction being a direction from the first electrode toward the second electrode and the second direction perpendicularly intersecting with the first direction.

2. The semiconductor device of claim 1,
   wherein at least one of the first and second field plate electrodes is comprised of a first portion and a second portion configured to be disposed alternately in the second direction,
   the second portion is shorter than the first portion in the first direction, and
   a width of the first portion is smaller than a width of the second portion in the second direction.

3. The semiconductor device of claim 1,
   wherein at least one of the first and second field plate electrodes comprises a first portion and a second portion configured to be disposed alternately in the second direction and different to each other in length, and
   a difference between a length of the first portion and a length of the second portion is smaller than the width of the second portion.

4. The semiconductor device of claim 1,
   wherein at least one of the first and second field plate electrodes comprises a comb-like planar shape at an end portion thereof on the side of the second electrode.

5. The semiconductor device of claim 1,
   wherein at least one of the first and second field plate electrodes comprises a trapezoid wave-like planar shape at an end portion thereof on the side of the second electrode.

6. The semiconductor device of claim 1,
   wherein at least one of the first and second field plate electrodes comprises a wave-like planar shape at an end portion thereof on the side of the second electrode.

7. The semiconductor device of claim 1,
wherein at least one of the first and second field plate electrodes comprises a first portion and a second portion configured to be disposed alternately in the second direction and different to each other in length, and
a period in which a length of at least one of the first and second field plate electrodes changes in the second direction is larger than a difference between a length of the first portion in the first direction and a length of the second portion in the first direction.

8. The semiconductor device of claim 1,
wherein a length of each of the first and second field plate electrodes in the first direction from the first electrode toward the second electrode changes periodically in the second direction perpendicularly intersecting with the first direction, and
a change in length of the second field plate electrode is larger than a change in length of the first field plate electrode.

9. The semiconductor device of claim 8,
wherein a ratio between a change in length of the first field plate electrode and a change in length of the second field plate electrode is equal to a ratio between a thickness of the first insulating film and a total sum of a thickness of the first insulating film and that of the second insulating film.

10. The semiconductor device of claim 1,
wherein a period in which a length of the second field plate electrode changes in the first direction is larger than a period in which a length of the first field plate electrode changes in the first direction.

11. The semiconductor device of claim 1,
wherein a length of the first field plate electrode changes in a phase different from that in which a length of the second field plate electrode changes.

12. The semiconductor device of claim 1, further comprising a third electrode on the second semiconductor layer configured to be electrically connected to the second semiconductor layer and disposed on a side opposite the second electrode in such a manner that the first electrode is interposed between the second electrode and the third electrode,
wherein the second field plate electrode is electrically connected to the third electrode, and
the first electrode constitutes a control electrode of a field effect transistor and the second and third electrodes constitute a main electrodes of the field effect transistor.

13. The semiconductor device of claim 12,
wherein a length of the first electrode in the first direction changes periodically in the second direction.

14. The semiconductor device of claim 13,
wherein the change in length of the first electrode is smaller than that in length of the first or second field plate electrode.

15. The semiconductor device of claim 1, further comprising a third electrode on the second semiconductor layer configured to be electrically connected to the second semiconductor layer and disposed on a side opposite the second electrode in such a manner that the first electrode is interposed between the second electrode and the third electrode,
wherein the first electrode constitutes a control electrode of a field effect transistor and the second and third electrodes constitute main electrodes of the field effect transistor,
the first field plate electrode comprises a first portion and a second portion different to each other in length configured to be separated from each other and alternately disposed in the second direction,
the second field plate electrode comprises a third portion and a fourth portion different to each other in length configured to be separated from each other and alternately disposed in the second direction,
the first and third portions are commonly connected to the first electrode, and
the second and fourth portions are commonly connected to a third electrode.

16. The semiconductor device of claim 1, further comprising a third electrode on the second semiconductor layer configured to be electrically connected to the second semiconductor layer and disposed on a side opposite the second electrode in such a manner that the first electrode is interposed between the second electrode and the third electrode,
wherein the first electrode constitutes a control electrode of a field effect transistor and the second and third electrodes constitute main electrodes of the field effect transistor,
the first field plate electrode comprises a first portion and a second portion different to each other in length configured to be connected to the first electrode, respectively, separated from each other and alternately disposed in the second direction, and
the second field plate electrode comprises a third portion and a fourth portion different to each other in length configured to be separated from each other and alternately disposed in the second direction, the third portion being connected to the first electrode via the first field plate electrode and the fourth portion being connected to the third electrode.

17. The semiconductor device of claim 1,
wherein the first electrode is an anode electrode configured to give a Schottky contact between the first electrode and the second semiconductor layer,
the second electrode is a cathode electrode configured to give Ohmic contact between the second electrode and the second semiconductor layer, and
the second field plate electrode is electrically connected to the anode electrode.

* * * * *